(12) United States Patent
Leong et al.

(10) Patent No.: US 7,084,709 B1
(45) Date of Patent: Aug. 1, 2006

(54) HYBRID ANALOG/DIGITAL PHASE LOCK LOOP FREQUENCY SYNTHESIZER

(76) Inventors: Colin Wai Mun Leong, 616 McLeod St., Livermore, CA (US) 94550; Richard Miller, 1590 Kensington Cir., Los Altos, CA (US) 94024; Jagdeep Singh Bal, 18947 Alcott Way, Saratoga, CA (US) 95070

( * ) Notice: Subject to any disclaimer, the term of this patent is extended or adjusted under 35 U.S.C. 154(b) by 41 days.

(21) Appl. No.: 10/993,592

(22) Filed: Nov. 19, 2004

(51) Int. Cl.
*H03L 7/00* (2006.01)
*H03L 7/87* (2006.01)
*H03L 7/95* (2006.01)
*H03L 7/10* (2006.01)

(52) U.S. Cl. .......................... 331/11; 331/1 A; 331/17; 331/25; 331/DIG. 2; 327/156; 327/157; 327/159

(58) Field of Classification Search .............. 331/1 A, 331/8, 10–12, 17, 18, 25, DIG. 2; 327/156–159
See application file for complete search history.

(56) References Cited

U.S. PATENT DOCUMENTS

| 3,660,781 | A | | 5/1972 | Tewksbury et al. |
| 5,057,793 | A | * | 10/1991 | Cowley et al. ............. 331/1 A |
| 5,644,743 | A | | 7/1997 | Barrett, Jr. et al. |
| 5,739,727 | A | | 4/1998 | Lofter et al. |
| 6,028,460 | A | | 2/2000 | McCollum et al. |
| 6,657,464 | B1 | | 12/2003 | Balardeta et al. |

OTHER PUBLICATIONS

U.S. Appl. No. 11/039,113, Colin Wai Mun Leong, Method and Apparatus for a Hybrid Phase Lock Loop Frequency Synthesizer, filed Jan. 18, 2005.

\* cited by examiner

*Primary Examiner*—David Mis
(74) *Attorney, Agent, or Firm*—Carr & Ferrell LLP (57) ABSTRACT

A hybrid frequency synthesizer includes an analog phase lock loop (PLL), a PLL, and a control circuit to control an output oscillator. The control circuit combines a control signal from the analog PLL with a control signal from the digital PLL to form a composite control signal. The composite control signal is conditioned depending on a state of lock of the analog PLL and/or the digital PLL. The composite signal controls the phase and frequency of the output oscillator. The analog control signal and the digital PLL control signal may be given a percentage of over the hybrid frequency synthesizer depending on the state of lock of the PLL and/or the digital PLL. The composite control signal provides both rapid, accurate, and robust acquisition by the digital PLL, and a smooth transition thereafter to low noise phase lock by the analog PLL.

28 Claims, 6 Drawing Sheets

HYBRID ANALOG/DIGITAL PHASE LOCK LOOP FREQUENCY SYNTHESIZER

CROSS REFERENCE TO A RELATED APPLICATION

The present invention is related to U.S. patent application Ser. No. 11/039,113, entitled "METHOD AND APPARATUS FOR A HYBRID PHASE LOCK LOOP FREQUENCY SYNTHESIZER", filed Jan. 18, 2005.

BACKGROUND OF THE INVENTION

1. Field of the Invention

The present invention generally relates to the field of phase lock loop frequency synthesizers and multipliers, and specifically to a hybrid phase lock loop that includes a digital phase lock loop and an analog phase lock loop.

2. Description of the Related Art

Generally, communication systems utilize various forms of phase lock loop (PLL) circuits to synchronize one or more output signals, e.g., carrier signals, to a reference signal. One conventional analog PLL includes a stable low frequency reference oscillator, e.g., a voltage controlled crystal oscillator (VCXO), coupled to a harmonic generator. A signal output of the harmonic generator provides a reference signal to an analog phase detector. A filtered version of an error signal from the analog phase detector is input to a voltage controlled oscillator (VCO). The oscillator generates an output carrier signal at a desired frequency. The phase detector adjusts (e.g., tunes) the oscillator to synchronize the frequency and phase to the reference signal. Unfortunately, the analog PLL adjusts only over a narrow frequency range (i.e., tuning range) due to the limited capture range of the analog phase detector. The analog PLL can phase lock to any harmonic frequency of the reference signal that falls within the tuning range.

Conventional digital PLLs overcome many of the disadvantages of the analog PLL, such as the harmonic lock problem. A digital PLL generally includes a reference oscillator that provides a reference signal to a first digital frequency divider. An output of the first digital frequency divider is coupled to a digital frequency/phase detector. An output of the digital frequency/phase detector is coupled through a loop filter to an output oscillator. A sample of the output carrier signal generated by the output oscillator is coupled to a second digital frequency divider. A signal output of the second digital frequency divider is coupled as a feedback signal to the frequency/phase detector for comparison with the divided reference signal. The output carrier signal frequency is determined by the frequency of the reference signal multiplied by the ratio of the second digital divider to the first digital divider. Due to the wider capture range of the digital frequency/phase detector, the digital PLL provides tuning over a wide range of output carrier signal frequencies. Unfortunately, the digital implementation also encumbers the digital PLL with greater phase noise relative to the analog PLL.

Figure 1:
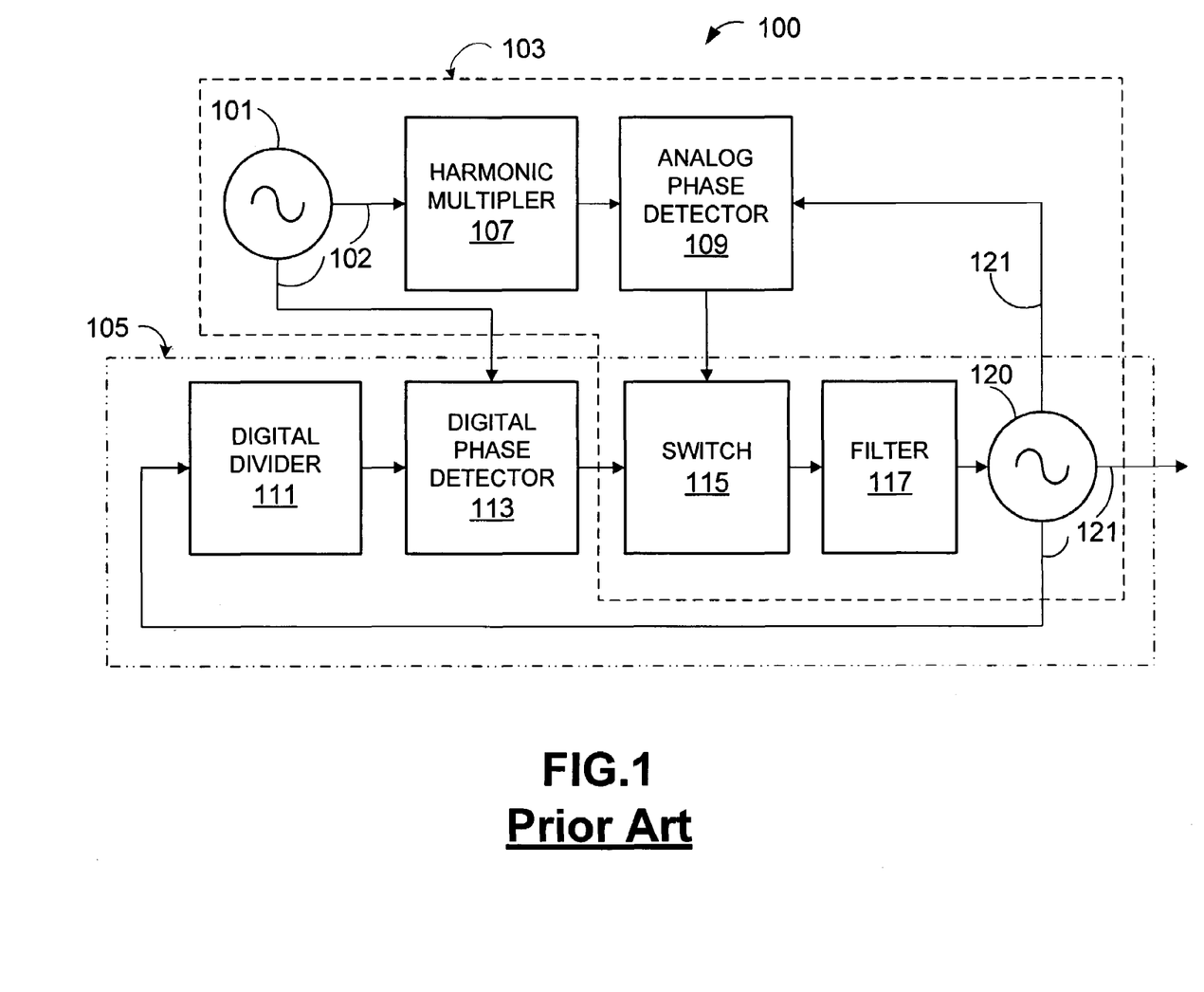
FIG. 1 is a high level schematic illustration of a prior art hybrid PLL frequency synthesizer.

Hybrid PLLs have been developed to capitalize on the benefits and avoid limitations of both the analog PLL and the digital PLL, as shown, for example, in U.S. Pat. No. 6,028,460. FIG. 1 illustrates a prior art hybrid PLL frequency synthesizer 100. Generally, such hybrid PLL frequency synthesizer 100 incorporates a hybrid PLL. The hybrid PLL includes a digital PLL 105 and an analog PLL 103. The digital PLL 105 and the analog PLL 103 are configured to individually acquire and phase lock an output carrier signal 121 from an output oscillator 120 to a reference signal 102 provided by a reference oscillator 101. Generally, during a frequency acquisition mode, the digital PLL 105 is used to acquire phase lock. Once the digital PLL 105 is phase locked, a switch 115 switches control of the hybrid PLL from the digital PLL 105 to the analog PLL 103. The analog PLL 103 then phase locks the output carrier signal 121 to a harmonic of the reference signal 102. The analog PLL 103 generally provides superior phase noise performance relative to the digital PLL 105.

The digital PLL 105 includes a digital divider 111 and a digital phase detector 113. The digital divider 111 digitally divides a sample of the output carrier signal 121 to the same frequency as the reference signal 102. The digitally divided signal is coupled to the digital phase detector 113 for frequency/phase comparison to the reference signal 102. The digital phase detector 113 provides a digital PLL control signal to a switch 115. When the digital PLL 105 is switched in control of the hybrid. PLL, the switch 115 provides the digital control signal to a loop filter 117. The loop filter 117 filters the digital PLL control signal before being coupled to the output oscillator 120.

The analog PLL 103 includes a harmonic multiplier 107 to multiply the reference signal 102 to the same frequency of the output carrier signal 121, or to a down converted version thereof. An analog phase detector 109 generates an analog control signal indicative of a phase comparison between the multiplied reference signal and a sample of output carrier signal 121. When the analog PLL 103 is switched in control of the hybrid PLL, the switch 115 provides the analog PLL control signal from the analog phase detector 109 to the loop filter 115. The loop filter 115 filters the analog PLL control signal before being coupled to the output oscillator 120.

Generally, the hybrid PLL requires the switch 115 to alternate complete PLL control between the analog PLL 103 and the digital PLL 105 depending on whether the frequency synthesizer 100 is in an acquisition mode or is in a steady state phase locked mode. Therefore, depending upon the state of switch 115, the hybrid PLL is controlled only by the analog PLL 103 or the digital PLL 105.

Once the analog PLL 103 is phase locked, the digital PLL 105 monitors the phase and frequency lock after switching control of the hybrid PLL to the analog PLL 103. If large frequency and/or phase perturbations of the analog PLL 103 are sensed, then switch 115 switches control of the hybrid PLL completely from the analog PLL 103 to the digital PLL 105. Under such conditions, the digital PLL 105 takes complete control of the hybrid PLL to reacquire phase lock. Once phase lock is reacquired, the switch 115 switches control of the hybrid PLL completely from the digital PLL 105 to the analog PLL 103.

Unfortunately, switching complete control of the hybrid PLL between the analog PLL 103 and the digital PLL 105 via switch 115 is an extremely coarse transition process. For example, such course transitions may lead to major perturbations of the output carrier signal 121. If not accounted for, such major perturbations may adversely affect downstream equipment coupled thereto. In addition, when the analog PLL 103 has complete control of the hybrid PLL, the phase relationship between the output carrier signal 121 and the reference signal 102 may be unknown.

SUMMARY OF THE INVENTION

One embodiment of the present invention is a frequency synthesizer. The frequency synthesizer includes an analog phase lock loop (PLL) configured to generate a first control signal based on a reference signal and an output signal from an output oscillator, and a digital PLL configured to generate a second control signal based on the reference signal and the output signal. The frequency synthesizer also includes a control circuit configured to monitor a state of lock of the analog PLL and the digital. PLL and generate a composite control signal to control the output oscillator.

Another embodiment of the present invention is a synthesizer system. The synthesizer system includes a means for generating an output signal and a first locking means for generating a first control signal indicative of a phase and frequency relationship between a reference signal and the output signal. The synthesizer system also includes a second locking means for generating a second control signal indicative of a phase and frequency relationship between the reference signal and the output signal. The second locking means has a higher phase noise than the first locking means. The synthesizer system further includes an output control means for generating a composite control signal to control the means for generating the output signal. The composite control signal includes a portion of the first control signal and a portion of the second control signal.

Another embodiment of the present invention is a method of generating an output carrier signal with an oscillator. The method includes generating a first control signal based on a reference signal and the output carrier signal with an analog PLL, and generating a second control signal based on the reference signal and the output carrier signal with a digital PLL. The method further includes monitoring a state of lock of the analog PLL and the digital PLL, generating a composite control signal based on a state of lock of the analog PLL and the digital PLL, and controlling the oscillator with the composite control signal.

For example, in one operation the composite control signal is dominated by the second control signal from the digital PLL during an acquisition mode. In the acquisition mode, the state of lock relative to the digital PLL and analog PLL is a phase unlocked condition transitioning to a phase locked condition. Conversely, in another operation the composite control signal is dominated by the first control signal from the analog PLL during a steady state mode. In the steady state mode, the state of lock associated with the digital PLL and the analog PLL is a steady state phase locked condition.

An advantage of the hybrid frequency synthesizer is that the composite PLL control signal provides rapid, accurate, and robust acquisition while maintaining low noise operation. Because the digital PLL monitors and retains some measure of control over the composite PLL control signal, the hybrid frequency synthesizer maintains lock over a wider range of conditions than a single analog PLL. In addition, the phase relationship between the reference signal and the output carrier signal can be maintained. Furthermore, although in some embodiments the analog PLL frequency locks very well, the analog PLL may lose phase lock, in which case phase lock may be reacquired rapidly with the aid of the digital PLL. In some embodiments, a control circuit automatically adjusts loop bandwidth and/or loop gain for the different modes between acquisition and locked states. The control circuit therefore provides optimal noise characteristics for the hybrid frequency synthesizer without sacrificing rapid acquisition and robust operation.

DETAILED DESCRIPTION

The embodiments discussed herein are illustrative of one example of the present invention. As embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

In general, a hybrid frequency synthesizer is described herein. The hybrid frequency synthesizer includes an analog PLL and a digital PLL. The analog PLL provides an analog PLL control signal. The digital PLL provides a digital PLL control signal. A control circuit monitors a state of lock of the analog PLL and the digital PLL, and combines the analog PLL control signal with the digital PLL control signal to form a composite PLL control signal. The composite PLL control signal provides overall phase and frequency control of an output oscillator. The output oscillator provides an output signal. The analog PLL and the digital PLL proportionally share control of the output oscillator and therefore share control of the output signal.

Through the control circuit and the composite PLL control signal, the analog PLL and the digital PLL proportionally share control of the output oscillator with respect to operational states of the hybrid frequency synthesizer. During one or more frequency acquisition states, the digital PLL may dominate the phase and the frequency control of the output oscillator. During the one or more frequency acquisition states, the loop elements are configured to adjust loop gain and/or bandwidth parameters and condition the composite control signal, accordingly to allow for fast frequency acquisition. During one or more steady state phase lock conditions, the analog PLL may dominate the phase and frequency control of the output oscillator. During the one or more steady state phase lock conditions, the loop elements are configured to adjust loop gain and/or bandwidth parameters accordingly to provide for a lower phase noise at the steady state phase lock conditions.

The composite PLL control signal provides rapid, accurate, and robust acquisition while maintaining low noise operation. Because the digital PLL retains some measure of control over the composite PLL control signal, the hybrid frequency synthesizer maintains lock over a wider range of conditions than a single analog PLL. In addition, the phase relationship between the reference signal and the output carrier signal can be maintained. Furthermore, although in some embodiments the analog PLL frequency locks accurately, the analog PLL may lose phase lock, in which case phase lock may be reacquired rapidly with the aid of the digital PLL. A control circuit automatically adjusts loop bandwidth and/or loop gain for the different modes between acquisition and locked states. The control circuit therefore provides optimal noise characteristics for the hybrid frequency synthesizer without sacrificing rapid acquisition and robust operation.

Figure 2:
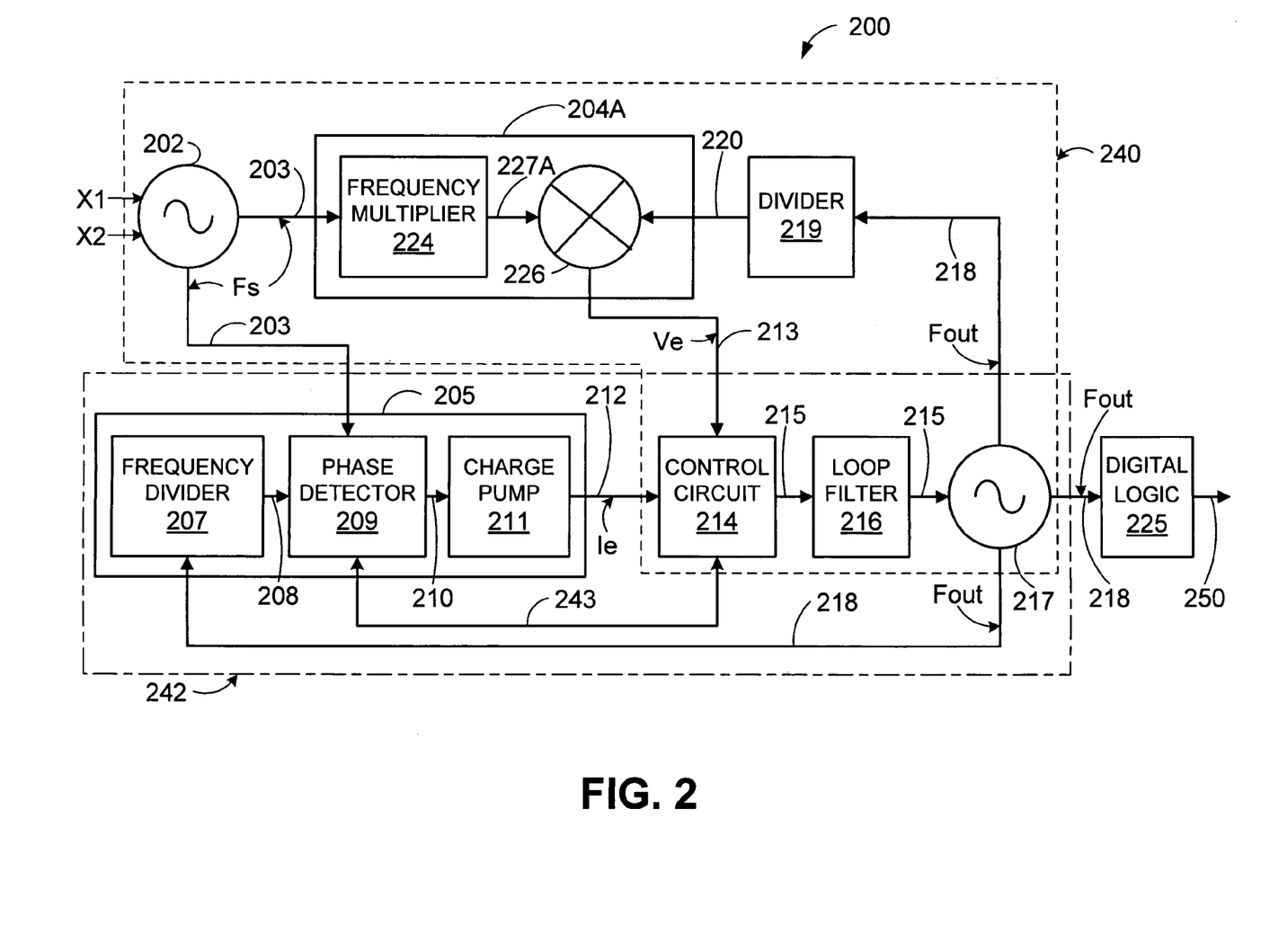
FIG. 2 is a high level schematic illustration of one embodiment of a frequency synthesizer, in accordance with the invention.

FIG. 2 is a high level schematic illustration of one embodiment of a hybrid frequency synthesizer 200, and FIGS. 3A–D are high level schematic illustrations of alternative embodiments of the analog phase lock loop circuit of FIG. 2, in accordance with the invention. The hybrid frequency synthesizer 200 includes a reference oscillator 202, an analog phase detector 204A, a digital frequency synthesizer 205, a divider 219, a control circuit 214, a loop filter 216, an output oscillator 217, and a digital logic circuit 225. An output signal 218 from the output oscillator 217 is coupled to an input of the digital logic circuit 225. The digital logic circuit 225 is configured to process the output signal 218 into an output signal 250 and direct the output signal 250 to external circuits (not shown) such as output buffer circuits, output dividers, etc. The reference oscillator 202 may be virtually any type of reference signal source such as a frequency generator, an oscillator, a voltage controlled oscillator (VCO), and a voltage controlled crystal oscillator (VCXO). The reference oscillator 202 may be operated by one or more input signals X1 and X2. In one configuration, the reference oscillator may include a digital divider which may be a fixed or a programmable digital divider circuit, an analog dividing circuit, a down converter circuit, and the like. In another embodiment of the present invention, the reference oscillator is replaced with an external reference clock.

In one configuration, the hybrid frequency synthesizer 200 includes an analog phase lock loop (PLL) 240 and a digital PLL 242. It will be appreciated that the analog PLL 240 and the digital PLL 242 may comprise various components, however for clarity the description will focus on one configuration. The analog PLL 240 includes the reference oscillator 202, the analog phase detector 204, the divider 219, the control circuit 214, the loop filter 216, and the output oscillator 217. The analog PLL 240 provides an analog PLL control signal 213 to the output oscillator 217. The analog PLL control signal 213 controls the output oscillator 217 and therefore the phase and frequency of the output signal 218. The digital PLL 242 includes the reference oscillator 202, the digital frequency synthesizer 205, the control circuit 214, the loop filter 216, and the output oscillator 217. The digital PLL 242 provides a digital PLL control signal 212 to the output oscillator 217. The digital PLL control signal 212 controls the output oscillator 217 and therefore the phase and frequency of the output signal 218.

In one embodiment, the control circuit 214 is configured to generate a composite PLL control signal 215 in response to the analog PLL control signal 213 and the digital PLL control signal 212 coupled thereto. In some embodiments, the composite PLL control signal 215 includes a portion of the analog PLL control signal 213 and a portion of digital PLL control signal 212. In some embodiments, the composite PLL control signal 215 is derived from both the analog PLL control signal 213 and the digital PLL control signal 212. The control circuit 214 is configured to determine an overall PLL control of composite signal 215. In one configuration, overall PLL control is proportionally divided between the analog PLL control signal 213 and the digital PLL control signal 212 with respect to one or more operational states of the hybrid frequency synthesizer 200. The composite PLL control signal 215 is coupled to an input of the loop filter 216. The loop filter 216 is configured to output a filtered version of the composite PLL control signal 215 in response thereto. The filtered version of the composite PLL control signal 215 is coupled to an input, e.g., tuning input, of the output oscillator 217. The composite PLL control signal 215 is configured to control the frequency and the phase of the output signal 218.

In one embodiment of the analog PLL 240, the reference signal 203 is coupled to one input of the analog phase detector 204A. A portion of the output signal 218 is processed by a divider 219 to form a divided signal 220. The divided signal 220 is coupled to another input of the analog phase detector 204A. The analog phase detector 204A generates the analog PLL control signal 213 in response to the reference signal 203 and the divided signal 220. The divider 219 may be virtually any type of divider circuit or device configured to divide the output signal 218. For example, the divider 219 may be a fixed or a programmable digital divider circuit, an analog dividing circuit, a down converter circuit, and the like.

In one configuration, the analog phase detector 204A includes a frequency multiplier 224 and a mixer 226. The frequency multiplier 224 is configured to multiply the reference signal 203 to a multiple signal 227A, e.g., $1F_s$, $2F_s$, $3F_s$ ... $NF_s$. The multiple signal 227A is coupled to an input of the mixer 226. The frequency multiplier 224 may be any type of frequency multiplier device such as one or more fixed or programmable frequency doublers in a cascade, frequency up converters, and the like.

Figure 3A:
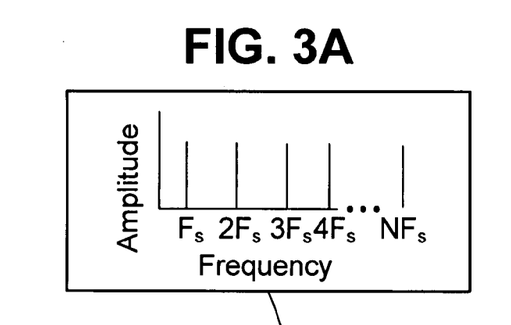
FIG. 3A is a high level graphical illustration of a plurality of harmonics of a reference frequency signal of FIG. 3B, in accordance with the invention.
Figure 3B:
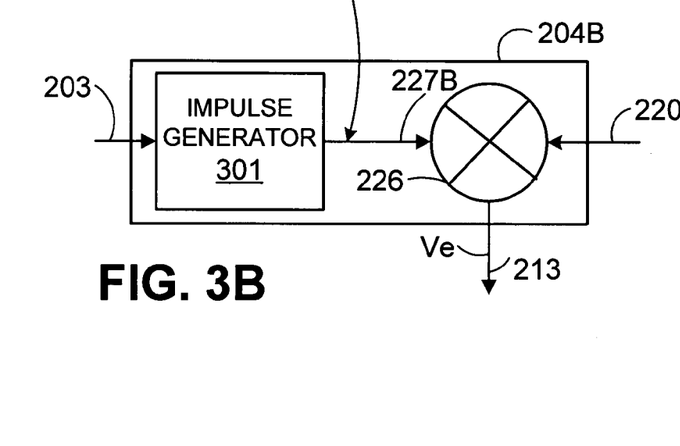
FIG. 3B is a high level schematic illustration of an alternative embodiment of an analog phase lock loop of FIG. 1, in accordance with the invention.

As illustrated in FIG. 3B, in one configuration, the analog phase detector 204A may be configured as an analog phase detector 204B. The analog phase detector 204B includes an impulse generator 301 having an output coupled to an input of the mixer 226. The impulse generator 301 generates a very narrow width output pulse in response to the reference signal 203. The narrow pulse generates the multiple signal 227B having a plurality of harmonic frequencies of the reference signal 203, e.g., $F_s$, $2F_s$, $3F_s$ ... $NF_s$, where N is a harmonic number, as illustrated in FIG. 3A. The narrow pulse is sufficiently narrow in time to generate a large number of harmonics with substantially equal amplitude. The impulse generator 301 may include one or more impulse devices such as a comb generator circuit, a step recovery diode circuit, and the like, to provide the harmonics.

Figure 3C:
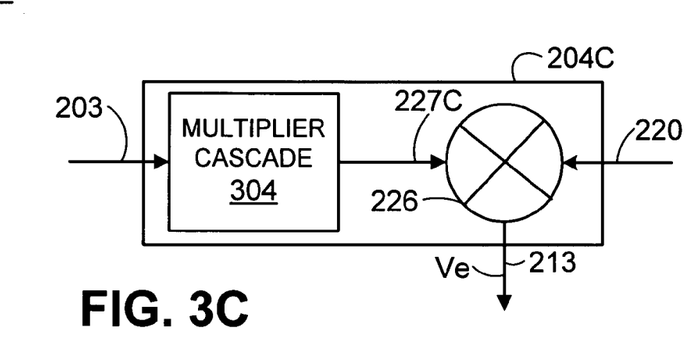
FIG. 3C is a high level schematic illustration of an alternative embodiment of an analog phase lock loop of FIG. 1, in accordance with the invention.

As illustrated in FIG. 3C, in one embodiment, the analog phase detector 204A may be configured as an analog phase detector 204C. The analog phase detector 204C includes a cascade of frequency multiplier devices 304 configured to multiply the reference signal 203 to a multiple signal 227C.

One configuration of frequency multiplier devices 304 includes analog mixers configured as frequency doublers.

Figure 3D:
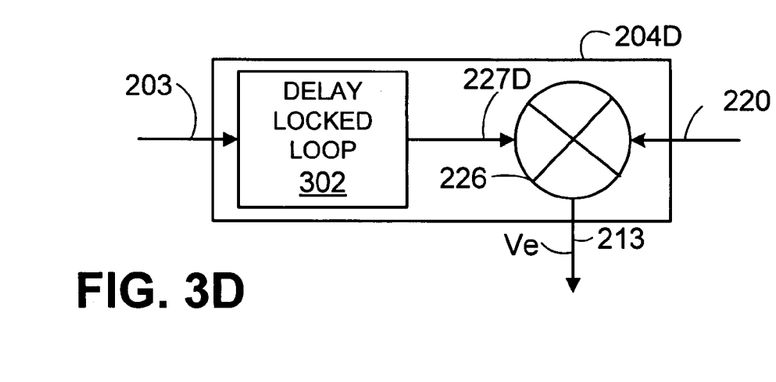
FIG. 3D is a high level schematic illustration of an alternative embodiment of an analog phase lock loop of FIG. 1, in accordance with the invention.

As illustrated in FIG. 3D, in one configuration, the analog phase detector 204A may be configured as an analog phase detector 204D. The analog phase detector 204D may include a delay locked loop (DLL) circuit 302 configured to generate a signal 227D at an integer multiple of the reference signal 203. DLL circuit 302 may be virtually any type of DLL apparatus and circuit that may be used to advantage.

Referring to FIG. 2 and FIGS. 3A–D, the mixer 226 mixes the divided signal 220 and the multiple signal 227 together to generate the analog PLL control signal 213. The analog PLL control signal 213 is generated by the mixer 226 in response to a phase difference and a frequency difference between the divided signal 220 and the multiple signal 227. The mixer 226 may be virtually any mixer type or circuit configured to mix the multiple signal 227 and the divided signal 220 together.

The analog PLL control signal 213 may be virtually any type of PLL control signal type that may be used to advantage. For example, in one embodiment, the analog PLL control signal 213 is configured as a voltage signal Ve. An amplitude and frequency of the voltage signal Ve indicates the phase difference and the frequency difference between the divided signal 220 and the multiple signal 227. The analog PLL control signal 213 is provided to an input of the control circuit 214 for processing as described further herein. For clarity, the analog PLL control signal 213 is described herein in terms of a voltage signal. However, other types of PLL control signals, such as current signals, are contemplated.

Referring to FIG. 2, in one embodiment of the digital PLL 242, the digital frequency synthesizer 205 includes a digital frequency divider 207, a digital frequency/phase detector 209, and a charge pump 211. A sample of the output signal 218 is coupled to an input of the digital frequency divider 207. The digital frequency divider 207 may be virtually any type of digital frequency device such as a programmable digital frequency divider, a fixed digital frequency divider, a non-integer divider, a counter circuit, and the like. The digital frequency divider 207 is configured to provide a digitally divided signal 208 having a similar frequency to that of the reference signal 203 to an input of the digital phase detector 209. The digital phase detector 209 determines a phase difference and a frequency difference between the digitally divided signal 208 and the reference signal 203 received thereto. The digital phase detector 209 is configured to generate an error signal 210 in response to such frequency and phase differences. The error signal 210 is coupled to an input of the charge pump 211. The charge pump 211 is configured to generate the digital PLL control signal 212 in response to the error signal 210. The digital PLL control signal 212 is coupled to another input of the control circuit 214 for processing as described further herein.

In one operational embodiment, the analog PLL 240 and the digital PLL 242 are configured to jointly control the output oscillator 217 and therefore the output signal 218 relative to one or more operational states of the hybrid frequency synthesizer 200. For example, during a frequency acquisition state of the hybrid frequency synthesizer 200, the digital PLL 242 provides dominant control of the output oscillator 217. Thus, during the frequency acquisition state the digital PLL 242 provides greater control over acquiring a phase and a frequency lock of the output signal 218 relative to the analog PLL 240. Conversely, when the output signal 218 is within a predetermined phase lock condition, the analog PLL 240 provides dominant control of the output oscillator 217. Thus, during such predetermined phase lock condition the analog PLL 240 provides greater control over the phase of the output signal 218 relative the digital PLL 242.

For example, in one joint control embodiment, the analog phase detector 204 compares the reference signal 203 to the divided signal 220 to generate the analog PLL control signal 213. The control circuit 214 combines a portion of the analog PLL control signal 213 with a portion of the digital PLL control signal 212 to generate the composite PLL control signal 215. The composite PLL control signal 215 is coupled to an input of the output oscillator 217 via the loop filter 216 to control the phase and the frequency of the output signal 218. A portion of the output signal 218 is coupled to an input of the divider 219. The divider 219 provides the divided signal 220 to the analog phase detector 204. The portion of the analog PLL control signal 213 controls the phase and frequency of the output oscillator 217. The portion of the analog PLL control signal 213 controls the output signal 218 with respect to an overall PLL control associated with the composite PLL control signal 215.

In another operational example, the reference signal 203 and a portion of the output signal 218 are coupled to the digital frequency synthesizer 205. The digital frequency synthesizer 205 generates the digital PLL control signal 212 in response to the reference signal 203 and the portion of the output signal 218 coupled thereto. The control circuit 214 combines a portion of the digital PLL control signal 212 with a portion of the analog PLL control signal 213 to generate the composite PLL control signal 215 having an overall PLL control. The composite PLL control signal 215 is coupled to an input of the output oscillator 217 via the loop filter 216 to control the phase and the frequency of the output signal 218. The portion of the digital PLL control signal 212 controls the output oscillator 217. Consequently, the portion of the digital PLL control signal 212 controls the output signal 218 with respect to the overall PLL control associated with the composite PLL control signal 215.

Figure 4:
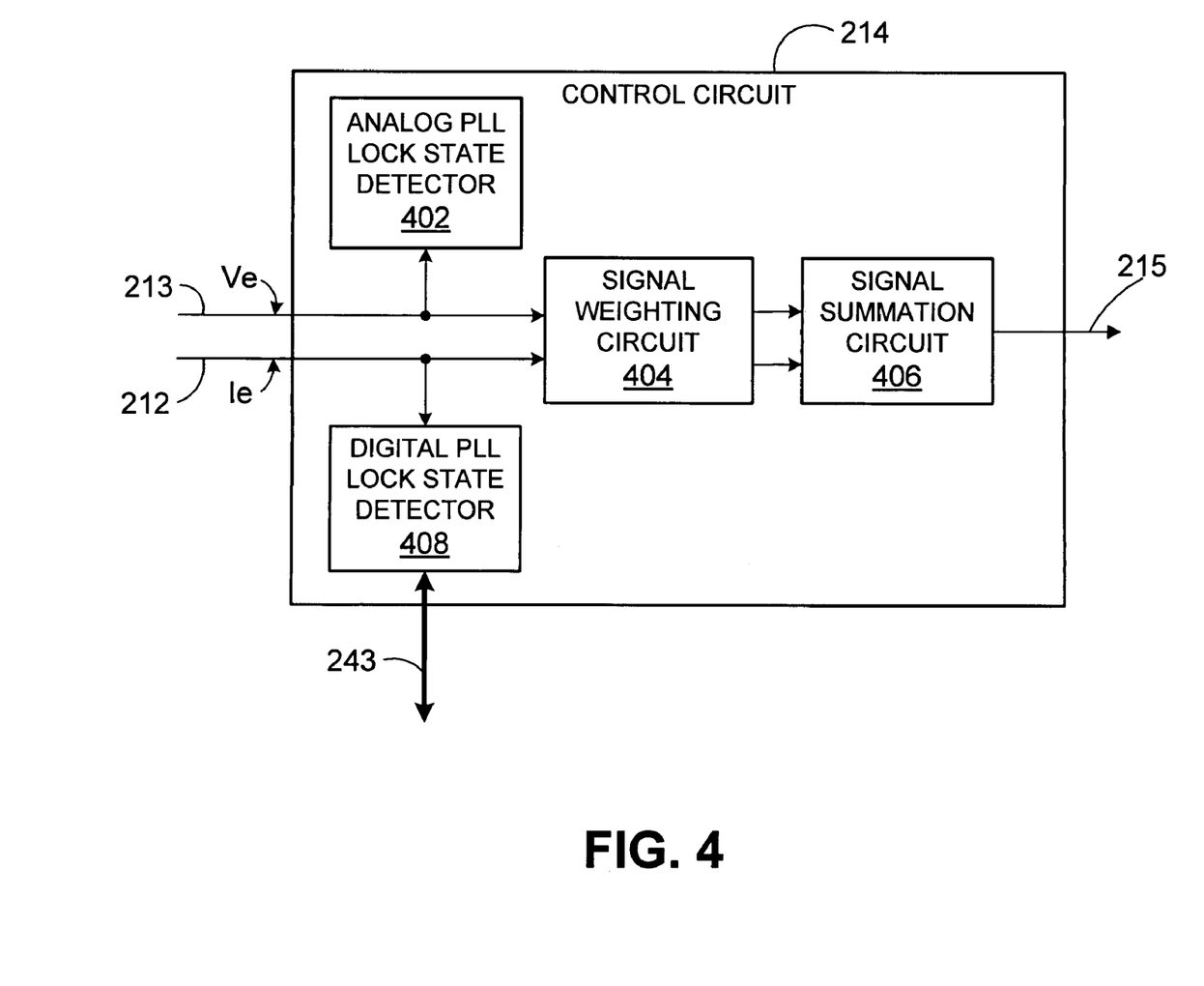
FIG. 4 is a high level schematic illustration of one embodiment of the control circuit of FIG. 1, in accordance with the invention.

FIG. 4 is a high level schematic illustration of one embodiment of the control circuit 214 of FIG. 2, in accordance with the invention. The control circuit 214 includes an analog PLL lock detector 402, a digital PLL lock detector 408, a signal weighting circuit 404, and a signal summation circuit 406. The analog PLL lock detector 402 is configured to determine one or more lock states of the analog PLL 240. In one embodiment, the analog PLL lock detector 402 determines a phase and a frequency lock state of the analog PLL 240 in response to a voltage level Ve of the analog PLL control signal 213. In another embodiment, the analog PLL lock detector 402 determines the phase and the frequency lock state of the analog PLL 240 in response to a current level of the analog PLL control signal 213.

The digital PLL lock detector 408 is configured to determine one or more lock states of the digital PLL 242. In one embodiment, the digital PLL lock detector 408 determines a phase and a frequency lock state of the digital PLL 242 in response to a current level of the digital PLL control signal 212. In another embodiment, the digital PLL lock detector 408 determines the phase and the frequency lock state of the digital PLL 242 in response to a voltage level of the digital PLL control signal 212. In one configuration, the digital phase detector 209 (See FIG. 2) couples phase/frequency lock data, e.g., a digital word of virtually any length, indicative of a phase/frequency lock state of digital PLL 242, to the digital PLL lock detector 408 via a bus 243. The digital PLL lock detector 408 processes such digital phase/ frequency lock data to determine a phase and a frequency lock state of the digital PLL 242. In other embodiments, the digital PLL lock detector 408 determines the phase and frequency lock state of the digital PLL 242 in response to a pulse width of the output signal 210 of the phase detector 209 or a pulse width of the digital PLL control signal 212.

In one embodiment, the digital PLL lock detector 408 monitors the state of phase lock of the analog PLL 240. For example, when the digital PLL lock state detector 408 determines that the digital PLL 242 is phase locked, the analog PLL is also considered phase locked. In another embodiment, the digital phase detector 209 is configured with a dead band condition. The dead band condition is defined herein where the digital PLL 242 is within a predefined range of zero PLL gain. Conversely, when the digital PLL lock state detector 408 determines that the digital PLL 242 is not phase locked, and is not in the dead band condition, the analog PLL is considered not phase locked. Therefore, in this configuration, the digital PLL lock state detector 408 monitors the analog PLL 240 by associating phase lock conditions of the digital PLL 242 to the analog PLL 240.

In one embodiment, the signal weighting circuit 404 is configured to proportionally divide total PLL control associated with the composite PLL control signal 215 between the digital PLL control signal 212 the analog PLL control signal 213. The signal weighting circuit 404 associates the division of total PLL control relative to one or more operational states of the hybrid frequency synthesizer 200. For example, the signal weighting circuit 404 assigns a weighted portion of the overall PLL control to the analog PLL control signal 213 relative to the phase and frequency lock state of the analog PLL 240. The signal weighting circuit 404 assigns a weighted portion of the overall PLL control to the digital PLL control signal 212 relative the phase and frequency lock state of the digital PLL 242.

In one operational embodiment, the signal weighting circuit 404 varies such proportional PLL control between the digital PLL control signal 212 and the analog PLL control signal 213 relative to changing operational states of the hybrid frequency synthesizer 200. For example, in a frequency acquisition mode, the signal weighting circuit 404 assigns a greater portion of the overall PLL control to the digital PLL control signal 212. Conversely, in a predetermined phase lock state, the signal weighting circuit 404 assigns a greater portion of overall PLL control to the analog PLL control signal 213.

In one embodiment, the signal weighting function is implemented by controlling the charge pump 211. The parameters of the charge pump 211 may be changed according to the phase lock state of the hybrid frequency synthesizer. For example, in a frequency acquisition mode, the parameters of the charge pump 211 are selected such that the digital PLL control signal 212 is large relative to the analog PLL control signal 213, thereby giving the digital PLL 242 a larger portion of the overall PLL control. Conversely, in the phase lock state, the parameters of the charge pump 211 may be adjusted such that the digital PLL control signal 212 is small relative to the analog PLL control signal 213, thereby giving the analog PLL 240 a larger portion of the overall PLL control.

In one embodiment, the loop gain of the analog PLL 240 is independently adjusted with respect to operational modes of the hybrid frequency synthesizer 200 by scaling the analog phase detector input 227 or the analog PLL control signal 213. For example, during the frequency acquisition mode, the digital PLL 242 may be responsible for an initial frequency acquisition and an initial phase lock of the output signal 218. In one embodiment, the digital PLL 242 is configured to set the output oscillator 217 such that the analog PLL 240 may frequency and phase lock the divided signal 220 to a desired harmonic of the reference signal 203 (See FIGS. 2 and 3). The loop gain of the analog PLL 240 may be scaled down such that the digital PLL 242 may be dominant in the phase lock control, thereby providing a faster frequency acquisition of the output signal 218 relative to a steady state phase lock condition.

When the output signal 218 approaches a predetermined steady state phase locked condition, the loop gain of the analog PLL 240 may be increased to a steady state loop gain to accommodate such steady state phase lock control condition of the analog PLL 240 and provide a lower phase noise. If such steady state condition is interrupted, the digital PLL 242 may regain dominant loop control until the predetermined phase lock condition is met. Subsequently, once the steady state phase lock condition is met, the analog PLL 240 regains dominate loop control.

The digital PLL control signal 212 is coupled to an input of the signal summation circuit 406. The analog PLL control signal 213 is coupled to another input of the signal summation circuit 406. The signal summation circuit 406 is configured to combine the digital PLL control signal 212 and the analog PLL control signal 213 to form the composite PLL control signal 215. The signal summation circuit 406 configures the composite PLL control signal 215 in response to weighted values associated with the digital PLL control signal 212 and the analog PLL control signal 213. For example, a greater weighted value may be associated with a greater control portion of the composite PLL control signal 215. The signal summation circuit 406 may be virtually any type of summation circuitry configured to generate the composite PLL control signal 215. For example, the signal summation circuit 406 may be formed from one or more operational amplifier circuits (not shown) configured to combine the digital PLL control signal 212 and the analog PLL control signal 213 relative to such weighted values. Further, although described as performing summation, the signal summation circuit 406 of some embodiments performs multiplication of the analog PLL control signal 213 and the digital PLL control signal 212. The signal summation circuit 406 may also perform signal processing on the analog PLL control signal 213 and the digital PLL control signal 212.

Figure 5:
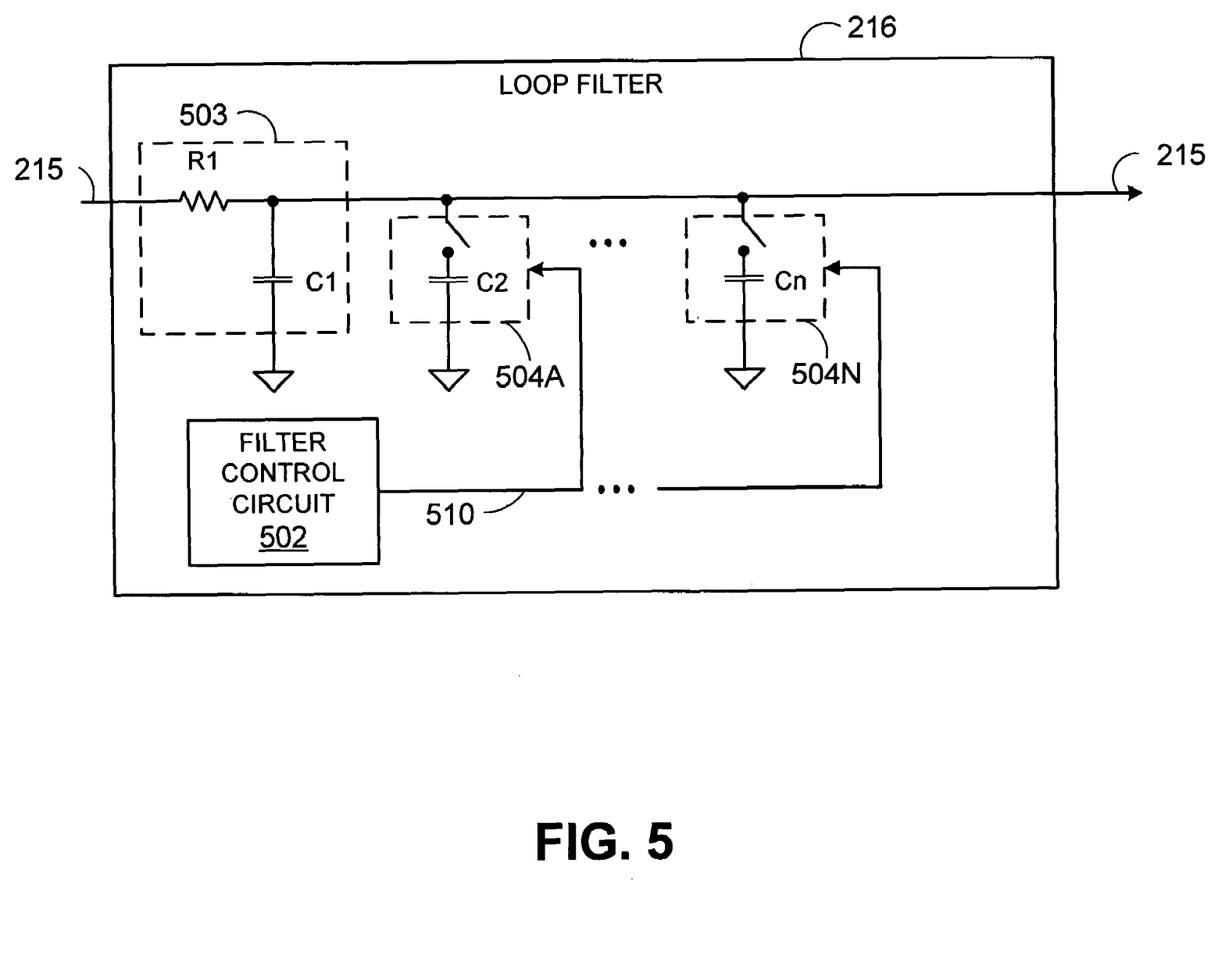
FIG. 5 is a high level schematic illustration of one embodiment of the loop filter of FIG. 1, in accordance with the invention.

FIG. 5 is a high level schematic illustration of one embodiment of the loop filter 216 of FIG. 2, in accordance with the invention. The loop filter 216 includes an input filter 503, a filter control circuit 502, and a plurality of switched filters 504A–N. The loop filter 216 is configured as a low pass to average the composite PLL control signal 215 coupled thereto. The loop filter 216 is configured to configure overall loop gain and/or bandwidth with respect to operational states of the hybrid frequency synthesizer 200. In one embodiment, the loop gain may be changed by scaling the digital PLL control signal 212 via the charge pump 211.

In one configuration, the composite PLL control signal 215 is coupled from an output of the control circuit 214 to an input of the input filter 503. The input filter 503 may be virtually any type of filter circuit configured to selectively low pass the composite PLL control signal 215. For example, the loop filter 216 may be a low pass filter of virtually any order. In one configuration, the input filter 503 may be configured as an integrator circuit.

An output of the input filter 503 provides the composite PLL control signal 215 to an input of one or more of the switched filters 504A through 504N, where N is defined as an nth number. The switched filters 504A–N may be virtually any type of low pass filter circuit configured to selectively pass a predetermined frequency range of the composite PLL control signal 215. For example, the switched filters 504A–N may be low pass filter circuits configured from one or more switched capacitors having an input electrically connected to the composite PLL control signal 215 and an output coupled to electrical ground. The switched filters 504A–N are controlled by the filter control circuit 502 via a control signal 510. The filter control circuit 502 may be virtually any device or circuit configured to operate the switched filters 504A–N. For example, the filter control circuit 502 may be a differential transistor circuit, an operational amplifier circuit, and the like, configured to operate the switched filters 504A–N.

In one embodiment, the signal summation circuit 406 may follow the filter function. In some configurations, the loop filter 216 may be configured as two independent loop filters with the outputs of the weighting circuit 404 providing the inputs to the independent filters. In some configurations, each independent loop filter may be configured as a low pass filter or as an integrator. In another configuration, one loop filter can be configured as a low pass filter for the analog PLL 240 and the other loop filter as an integrator for the digital PLL 242. In another configuration, one loop filter may be configured as a low pass filter for the digital PLL 242 and the other loop filter as an integrator for the analog PLL 240. The outputs of the independent filters are coupled to the inputs of the signal summation circuit 406.

In summary, the hybrid frequency synthesizer 200 includes the analog PLL 240 to provide the analog PLL control signal 213 and the digital PLL 242 to provide the digital PLL control signal 212. The control circuit 214 combines the analog PLL control signal 213 with the digital PLL control signal 212 to form the composite PLL control signal 215. The composite PLL control signal 215 provides overall phase and frequency control of the output oscillator 217 and therefore the output signal 218. The analog PLL 240 and the digital PLL 242 proportionally share control of the output oscillator 217 with respect to operational states of the hybrid frequency synthesizer 200. During one or more frequency acquisition states, the digital PLL 242 dominates the phase and frequency control of the output oscillator 217. The control circuit 214 adjusts loop gain or bandwidth parameters accordingly to allow for fast frequency acquisition. During one or more steady state phase lock conditions, the analog PLL 240 dominates such phase and frequency control of the output oscillator 217. The control circuit 214 adjusts loop gain and bandwidth parameters accordingly to provide for lower phase noise at such steady state phase lock conditions.

Figure 6:
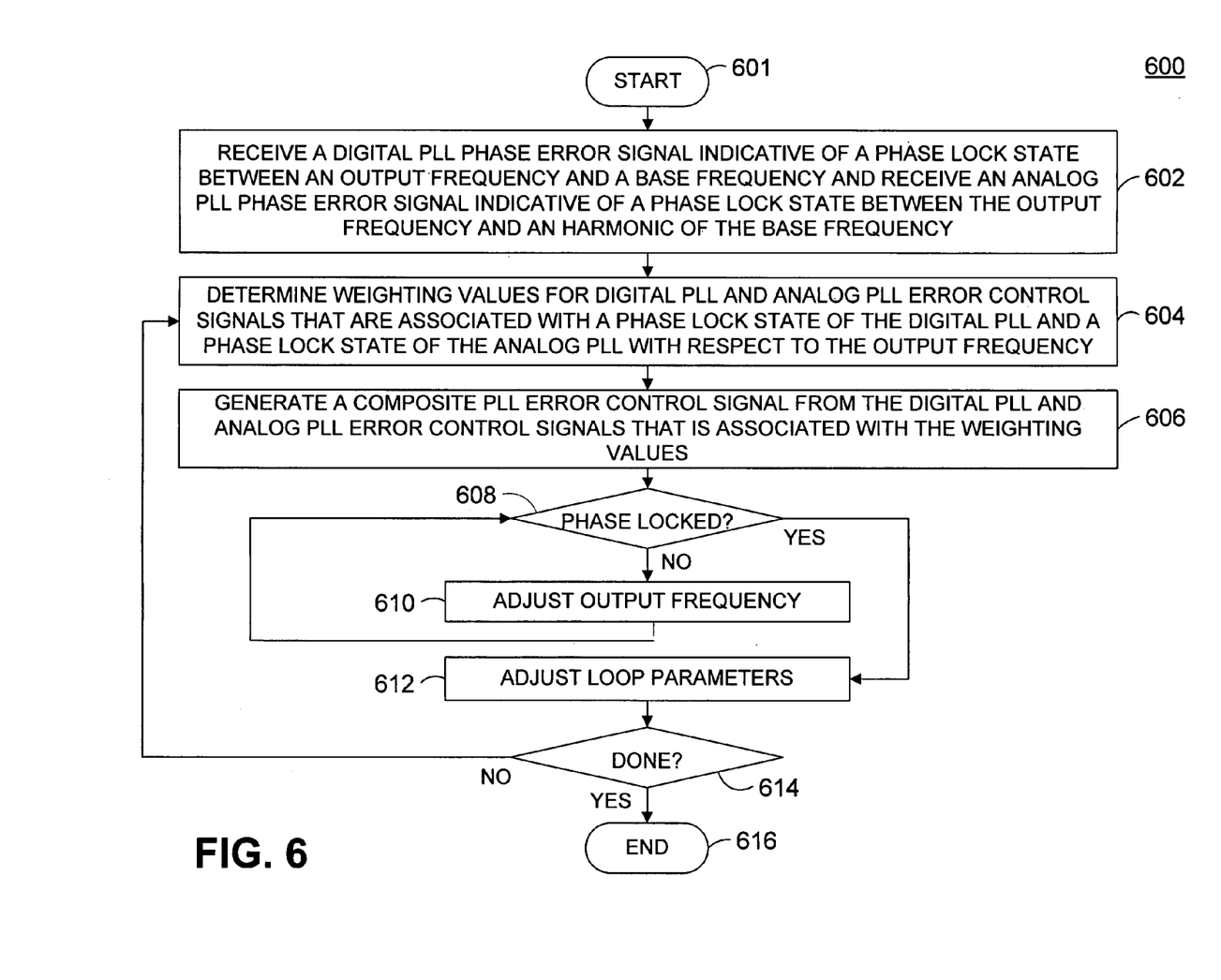
FIG. 6 is a high level flow diagram of one embodiment of a method of controlling the hybrid frequency synthesizer of FIG. 2, in accordance with the invention.

FIG. 6 is a high level flow diagram of one embodiment of a method 600 of controlling the hybrid frequency synthesizer 200 of FIG. 2, in accordance with the invention. The method 600 may be entered into at 601 when, for example, the hybrid frequency synthesizer 200 is configured by a user thereof to generate the output signal 218. At 602, the control circuit 214 receives the digital PLL control signal 212 indicative of a phase/frequency lock state of the digital PLL 242. At 602, the control circuit 214 receives the analog PLL control signal 213 indicative of a phase lock state of the analog PLL 240.

At 604, the method 600 determines weighting values relative to the phase/frequency lock states of the digital PLL 242 and the analog PLL 240. For example, during a frequency acquisition operation, the composite PLL control signal 215 is configured with a greater weighting value for the digital PLL 242 such that control of the output signal 218 is dominated by the digital PLL 242. During a steady state operation, the composite PLL control signal 215 is configured with a greater weighting value relative the analog PLL 240 such that control of the output signal 218 is dominated by the analog PLL 240. During transition states where the digital PLL 242 is approaching predetermined phase lock or dead band conditions, weighting values for the digital PLL 242 are decreased. During transition states where the digital PLL 242 is approaching phase lock or is in a predetermined dead band condition, weighting values for the analog PLL 240 are increased.

The digital PLL control signal 212 and the analog PLL control signal 213 are combined by the control circuit 214 in proportion to the weighting values at 606 into the composite PLL control signal 215. If at 608, the method 600 determines that the output signal 218 is within a desired phase lock condition, the method 600 proceeds to 612 described below. If at 608, the method 600 determines that the output signal 218 is not within a desired phase lock condition, the method 600 proceeds to 610. At 610, the composite PLL control signal 215 is configured to adjust the frequency and the phase of the output signal 218. At 612, the method 600 configures the loop parameters, such as loop gain, of the analog PLL 240 and the digital PLL 242 relative to the weighting values. For example, in the acquisition operation where the weighting values would be adjusted to accommodate the digital PLL 242 transitioning to a phase lock condition, the loop parameters would be adjusted relative weighting values indicative thereof. If however, the method 600 determines that the output signal 218 is within a desired phase lock condition, the loop parameters would be associated with weighting values indicative thereof. At 614, if the method 600 is finished, then the method 600 proceeds to 616 and ends. If however, the method 600 is not finished, the method 600 proceeds to 604.

An advantage of the hybrid frequency synthesizer 200 is that the composite PLL control signal provides rapid, accurate, and robust acquisition while maintaining low noise operation. Because the digital PLL 242 monitors and retains some measure of control over the composite PLL control signal, the hybrid frequency synthesizer 200 maintains lock over a wider range of conditions than a single analog PLL. In addition, the phase relationship between the reference signal 203 and the output carrier signal 218 can be maintained. Furthermore, although in some embodiments the analog PLL 240 frequency locks very well, the analog PLL 240 may lose phase lock, in which case phase lock may be reacquired rapidly with the aid of the digital PLL 242. The control circuit 214 automatically adjusts loop bandwidth and/or loop gain for the different modes between acquisition and locked states. The control circuit 214 therefore provides optimal noise characteristics for the hybrid frequency synthesizer 200 without sacrificing rapid acquisition and robust operation.

A further advantage of the hybrid frequency synthesizer 200 is that the PLL loop bandwidth and/or gain can be automatically adjusted for the different modes between acquisition and locked states. The loop parameters therefore provides optimal noise characteristics for the hybrid frequency synthesizer 200 without sacrificing rapid acquisition and robust operation.

The invention has been described above with reference to specific embodiments. Persons skilled in the art, however, will understand that various modifications and changes may be made thereto without departing from the broader spirit and scope of the invention as set forth in the appended claims.

The invention claimed is:

1. A frequency synthesizer, comprising:
an analog phase lock loop configured to generate a first control signal based on a reference signal and an output signal from an output oscillator;
a digital phase lock loop configured to generate a second control signal based on the reference signal and the output signal; and
a control circuit configured to monitor a state of lock of the analog phase lock loop and the digital phase lock loop and generate a composite control signal to control the output oscillator.

2. The frequency synthesizer of claim 1, wherein the composite control signal comprises a portion of the first control signal and a portion of the second control signal.

3. The frequency synthesizer of claim 1, wherein the composite control signal is based on the first control signal and the second control signal.

4. The frequency synthesizer of claim 1, wherein the composite control signal comprises predominately the second control signal if the digital phase lock loop is in an unlocked state.

5. The frequency synthesizer of claim 1, wherein the composite control signal comprises predominately the first control signal if the digital phase lock loop is in a locked state.

6. The frequency synthesizer of claim 1, wherein the first control signal comprises a first current, the second control signal comprises a second current, and the control circuit comprises a current summing circuit.

7. The frequency synthesizer of claim 1, further comprising a filter configured to condition the composite control signal.

8. The frequency synthesizer of claim 7, wherein parameters of the filter are determined based on the state of lock of at least one of the analog phase lock loop and the digital phase lock loop.

9. The frequency synthesizer of claim 1, further comprising means for conditioning loop gain parameters of at least one of the analog phase lock loop and the digital phase lock loop.

10. The frequency synthesizer of claim 9, wherein the loop gain parameters of at least one of the analog phase lock loop and the digital phase lock loop are determined based on the state of lock of at least one of the analog phase lock loop and the digital phase lock loop.

11. The frequency synthesizer of claim 1, wherein the control circuit comprises a circuit configured to adjust a weighting between the first control signal and the second control signal based on the state of lock of the analog phase lock loop and the digital phase lock loop.

12. A synthesizer system, comprising:
a means for generating an output signal;
a first locking means for generating a first control signal indicative of a phase and frequency relationship between a reference signal and the output signal;
a second locking means for generating a second control signal indicative of a phase and frequency relationship between the reference signal and the output signal, the second locking means having a higher phase noise than the first locking means; and
an output control means for generating a composite control signal to control the means for generating the output signal, the composite control signal including a portion of the first control signal and a portion of the second control signal.

13. The synthesizer system of claim 12, further comprising a means for monitoring a state of lock of the first locking means and the second locking means.

14. The synthesizer system of claim 12, wherein the first control signal comprises a first current, the second control signal comprises a second current, and the output control means comprises a means for combining the first current and the second current to form the composite control signal.

15. The synthesizer system of claim 12, wherein the output control means comprises a weighting circuit configured to determine the portion of the first control signal and the portion of the second control signal based on the state of lock of the first locking means and the second locking means.

16. The synthesizer system of claim 15, wherein the weighting circuit is further configured to determine that the composite control signal comprises predominately the second control signal if the second locking means is in an unlocked state.

17. The synthesizer system of claim 15, wherein the weighting circuit is further configured to determine that the composite control signal comprises predominately the first control signal if the second locking means is in a locked state.

18. The synthesizer system of claim 12, further comprising a filter means for adjusting loop bandwidth parameters of the first locking means and the second locking means.

19. The synthesizer system of claim 18, wherein the loop bandwidth parameters of the filter means are determined based on the state of lock of the first locking means and the second locking means.

20. A method, comprising:
generating an output carrier signal with an oscillator;
generating a first control signal based on a reference signal and the output carrier signal with an analog phase lock loop;
generating a second control signal based on the reference signal and the output carrier signal with a digital phase lock loop;
monitoring a state of lock of the analog phase lock loop and the digital phase lock loop;
generating a composite control signal based on a state of lock of the analog phase lock loop and the digital phase lock loop; and
controlling the oscillator with the composite control signal.

21. The method of claim 20, wherein the composite control signal comprises a portion of the first control signal and a portion of the second control signal.

22. The method of claim 20, wherein the composite control signal comprises predominately the second control signal if the digital phase lock loop is in an unlocked state.

23. The method of claim 20, wherein the composite control signal comprises predominately the first control signal if the digital phase lock loop is in a locked state.

24. The method of claim 20, wherein the first control signal comprises a first current, the second control signal comprises a second current, and generating the composite control signal comprises summing the first current and the second current.

25. The method of claim 20, further comprising filtering the composite control signal.

26. The method of claim 25, further comprising determining parameters for filtering based on the state of lock of the analog phase lock loop and the digital phase lock loop.

27. The method of claim 20, further comprising adjusting a weighting between the first signal and the second control signal based on the state of lock of the analog phase op and the digital phase lock loop.

28. The method of claim 20, further comprising adjusting a weighting between the first signal and the second control signal based on a predetermined dead band ion of the digital phase locked loop.

* * * * *